(12) United States Patent
Kataoka et al.

(10) Patent No.: US 7,893,167 B2
(45) Date of Patent: Feb. 22, 2011

(54) SEALING FILM FOR SOLAR CELL AND SOLAR CELL USING THE SEALING FILM

(75) Inventors: Hisataka Kataoka, Yokohama (JP); Ichiro Aoki, Yokohama (JP)

(73) Assignee: Bridgestone Corporation, Tokyo (JP)

( * ) Notice: Subject to any disclaimer, the term of this patent is extended or adjusted under 35 U.S.C. 154(b) by 57 days.

(21) Appl. No.: 12/295,890

(22) PCT Filed: Apr. 5, 2007

(86) PCT No.: PCT/JP2007/057639

§ 371 (c)(1),
(2), (4) Date: Jan. 30, 2009

(87) PCT Pub. No.: WO2007/116928

PCT Pub. Date: Oct. 18, 2007

(65) Prior Publication Data

US 2009/0159129 A1   Jun. 25, 2009

(30) Foreign Application Priority Data

Apr. 5, 2006   (JP) .............................. 2006-104272

(51) Int. Cl.
*C08F 8/06* (2006.01)

(52) U.S. Cl. ..................... 525/387; 526/319; 526/348.1
(58) Field of Classification Search .................. 525/387; 526/319, 348.1
See application file for complete search history.

(56) References Cited

FOREIGN PATENT DOCUMENTS

| JP | 11-026791 | * | 1/1999 |
|----|-----------|---|--------|
| JP | 11-026791 A | | 1/1999 |
| JP | 2000-095889 | * | 4/2000 |
| JP | 2000-095889 A | | 4/2000 |
| WO | 2006/085603 A1 | | 8/2006 |

* cited by examiner

*Primary Examiner*—Ling-Siu Choi
(74) *Attorney, Agent, or Firm*—Sughrue Mion, PLLC

(57) ABSTRACT

The object of the present invention is to provide a sealing film having excellent productivity, and improved light resistance and heat resistance, and a solar cell provided with the sealing film.

A sealing film for a solar cell comprising ethylene-vinyl acetate copolymer and an organic peroxide, wherein the organic peroxide comprises an organic peroxide A having a 10 hour half-life in the range of 110 to 130° C. in and an organic peroxide B having a 10 hour half-life in the range of 80 to 100° C.; and a solar cell having the sealing film.

16 Claims, 1 Drawing Sheet

SEALING FILM FOR SOLAR CELL AND SOLAR CELL USING THE SEALING FILM

BACKGROUND OF INVENTION

1. Field of the Invention

The present invention relates to a sealing film for a solar cell consisting chiefly of ethylene-vinyl acetate copolymer and a solar cell using the sealing film, particularly a sealing film and a solar cell having excellent productivity and a process for the preparation of the solar cell.

2. Description of the Related Art

A solar cell (solar cell module) has been paid attention as a device directly converting solar energy into electric energy from the viewpoints of effective use of natural resources and ecology, and various solar cells have been developed.

As shown in FIG. 1, a solar cell has a structure that silicon photovoltaic elements 4 (photovoltaic elements made of silicon etc.) are sealed by ethylene-vinyl acetate copolymer (EVA) sealing films 3A, 3B between a glass plate 1 as a transparent front side protection material and a backside protection material 2 (backside covering member). A sealing film arranged on light-receiving side of the photovoltaic elements is hereinafter referred to as a front side sealing film and a sealing film arranged on rear side of the photovoltaic elements is hereinafter referred to as a backside sealing film.

The solar cell is prepared by the following steps: a step superposing a glass plate 1, an EVA film (sealing film) 3A, silicon photovoltaic elements 4, an EVA film (sealing film) 3B and a backside covering member 2 in this order and a step curing or crosslinking them by heating to combine with each other.

In the solar cell, it is strongly demanded that light incident upon the solar cell is effectively taken into the photovoltaic elements of the solar cell as much as possible from the viewpoint of improvement of power generation efficiency. Hence, desired is the EVA film for sealing which has high transparency and therefore has properties transmitting almost incident solar light without absorbing and reflecting the solar light. Further when the solar cell is used for long time period, the EVA film is discolored due to influence of light and heat to show tendency of transmittance of sunlight to reduce. Therefore an EVA sealing film having excellent light resistance and heat resistance is demanded.

When a solar cell (module) is prepared, even the EVA film for sealing having excellent transparency, light resistance and heat resistance requires a long time period in a step for sealing the photovoltaic elements between the transparent substrates. The step is disadvantageous in view of productivity, and hence reduction of time period of the step is desired. In more detail, in a process for superposing a glass plate 1, a front side EVA film (sealing film) 3A, silicon photovoltaic elements 4, a back side EVA film (sealing film) 3B and a backside covering member 2 in this order and curing or crosslinking them by heating to combine with each other, the step for curing or crosslinking the EVA films requires tens minutes period, which is deemed to the cause requiring long time period for the preparation of the solar cell.

Generally, an EVA film can be rapidly cured or crosslinked by using an organic peroxide (crosslinker) having high reactivity due to reduced half-life temperature. However, the use of the organic peroxide (e.g., alkyl-peroxy ester, peroxy ketal) having reduced half-life temperature, the crosslinked EVA film is apt to generate blister with long-term use.

Patent Document 1 (JP 11-26791A) proposes that dialkyl peroxide and alkylperoxy ester or peroxy ketal are used in a ratio by weight of 10/90 to 90/10 as an organic peroxide (crosslinker). Further Patent Document 1 describes that the use of the organic peroxides brings about reduction of crosslinking time period, whereby a solar cell provided with a crosslinked film free from yellowing and blister can be obtained.

Patent Document 1: JP11-26791A

SUMMARY OF THE INVENTION

Problem to be Solved by the Invention

In Examples of Patent Document 1, dialkyl peroxide and alkylperoxy ester and/or peroxy ketal as organic peroxides are used in a ratio by weight of 1/1 to 1/2. The present inventors have revealed that the use of the organic peroxides in the ratio brings about reduction of crosslinking time period but the resultant solar cell is apt to suffer from yellowing and blister.

The present inventors have studied as to usage of the organic peroxides, and demonstrated that the combination of dialkyl peroxide as main component with a small amount of alkylperoxy ester brings about reduction of crosslinking time period and the resultant film is free from yellowing and blister.

In view of the above viewpoints, the object of the present invention is to provide a sealing film for solar cell having excellent productivity and good appearance free from yellowing and blister.

Moreover, the object of the present invention is to provide a sealing film for solar cell having excellent productivity, good appearance, and improved light resistance and heat resistance.

Further, the object of the present invention is to provide a solar cell having excellent productivity and good appearance obtained by using the sealing film for solar cell.

Furthermore, the object of the present invention is to provide a solar cell having excellent productivity, good appearance, and improved light resistance and heat resistance obtained by using the sealing film for solar cell.

Still, the object of the present invention is to provide a process for advantageously preparing the solar cell.

Means for Solving Problem

The above object is attained by the present invention, i.e., a sealing film for a solar cell comprising ethylene-vinyl acetate copolymer and an organic peroxide, wherein the organic peroxide comprises an organic peroxide A having a 10 hour half-life temperature of 110 to 130° C. in and an organic peroxide B having a 10 hour half-life temperature of 80 to 100° C.

The preferred embodiments of the sealing film for a solar cell according to the present invention are described as follows:

(1) The organic peroxide A is dialkyl peroxide represented by the following formula I:

[Formula 1]

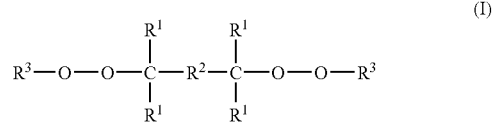

in which each of $R^1$ independently represents an alkyl group of 1 to 3 carbon atom, $R^2$ represents an ethylene group, an ethynylene group or a phenylene group, and each of $R^3$ independently represents a branched alkyl group of 3 to 5 carbon atoms or a phenyl group, and the organic peroxide B is peroxy ester represented by the following formula II:

[Formula 2]

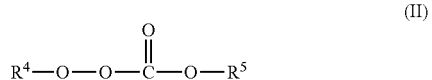
(II)

in which $R^4$ represents a branched alkyl group of 3 to 5 carbon atoms and $R^5$ represents a branched alkyl group of 6 to 9 carbon atoms, and/or peroxy ketal represented by the following formula III:

[Formula 3]

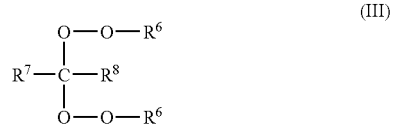
(III)

in which each of $R^6$ independently represents a branched alkyl group of 3 to 8 carbon atoms, and each of $R^7$ and $R^8$ independently represents a straight or branched alkyl group of 1 to 8 carbon atom, wherein $R^7$ and $R^8$ may unite with each other to form a ring of 5 to 9 carbon atoms.

(2) A ratio by weight (organic peroxide B/organic peroxide A) of the organic peroxide B to the organic peroxide A is in the range of 1/99 to 9/91, especially 2/98 to 8/92.

(3) In the formula I, $R^1$ represents a methyl group, $R^2$ represents an ethylene group, and $R^3$ represents a tert-butyl group.

(4) In the formula II, $R^4$ represents a tert-butyl group, and $R^5$ represents an 2-ethylhexyl group.

(5) In the formula III, $R^6$ represents a tert-hexyl group (1,1-dimethylbutyl group), and $R^7$ and $R^8$ unit with each other to form 3,3,5-trimethylcyclohexyl.

(6) The organic peroxide is totally contained in the amount of 0.1 to 5.0 part by weight, preferably 0.2 to 3.0 part by weight, based on 100 parts by weight of the ethylene-vinyl acetate copolymer.

Further, the crosslinking temperature of the sealing film of the invention is preferably in the range of 135 to 180° C., especially 140 to 180° C. The crosslinking time period is generally in the range of 5 to 30 minutes, especially 5 to 15 minutes.

(5) A crosslinking auxiliary agent (compound having radical polymerizable group) is contained in the amount of 0.1 to 5.0 part by weight based on 100 parts by weight of the ethylene-vinyl acetate copolymer.

(6) The sealing film for a solar cell further contains dihydroxy-dimethoxybenzophenone ultraviolet absorber. Yellowing control effect in the case of using the organic peroxide is improved.

(7) The sealing film for a solar cell further contains a silane-coupling agent. Enhancement of adhesion property and heat resistance can be obtained.

(8) A vinyl acetate recurring unit of the ethylene-vinyl acetate copolymer is contained in the amount of 10 to 36% by weight based on the weight of the ethylene-vinyl acetate copolymer. Excellent transparency is brought about.

(9) The sealing film for a solar cell has yellowness index ($\Delta YI$) of not more than 1.5, the yellowness index being measured according to JIS K 7501 after allowing the sealing film to stand for 1,000 hours under the environment (temperature of 85° C. and relative humidity of 85%) according to JIS C 8917. Improved heat-humidity resistance can be obtained.

(10) The sealing film for a solar cell has yellowness index ($\Delta YI$) of not more than 2.0, the yellowness index being measured according to JIS K 7501 after allowing the sealing film to stand for 1,000 hours under the environment including exposure to ultraviolet radiation (temperature of 63° C., relative humidity of 53% and exposure to ultraviolet radiation of 1,000 W/m$^2$) according to JIS C 8917. Improved light resistance can be obtained.

Further the invention is provided by a solar cell comprising a transparent front side protection material (front side covering member), a backside protection material (backside covering member) and photovoltaic elements sealed therebetween by a sealing film, wherein the sealing film for a solar cell as defined above is interposed between the transparent front side protection material and backside covering material to be crosslinked and combined with each other.

The above-mentioned solar cell is advantageously obtained by a process for the preparation of a solar cell comprising interposing two sealing films between a transparent front side protection material and a backside protection material, interposing photovoltaic elements between the two sealing films and bonding them under pressure to seal the photovoltaic elements, wherein the sealing film for a solar cell as defined above is used, and after interposing of the photovoltaic elements, they are bonded under pressure and heating at temperature of 135 to 180° C. (preferably 155 to 180° C.) for 5 to 15 minutes to be crosslinked and combined with each other.

In more detail, the use of the sealing film of the invention enables sealing of photovoltaic elements at relatively enhanced temperatures for reduced time period. The resultant sealing film and solar cell have excellent appearance, light resistance and heat and humidity resistance.

The sealing film obtained by the process of the invention has yellowness index ($\Delta YI$) of not more than 1.5, the yellowness index being measured according to JIS K 7501 after allowing the sealing film to stand for 1,000 hours under the environment (temperature of 85° C. and relative humidity of 85%) according to JIS C 8917. Therefore the sealing film shows excellent heat and humidity resistance.

The sealing film obtained by the process of the invention has yellowness index ($\Delta YI$) of not more than 2.0, the yellowness index being measured according to JIS K 7501 after allowing the sealing film to stand for 1,000 hours under the environment including exposure to ultraviolet radiation (temperature of 63° C., relative humidity of 53% and exposure to ultraviolet radiation of 1,000 W/m$^2$) according to JIS C 8917. Therefore the sealing film shows excellent light resistance.

Effect of the Invention

The sealing film for a solar cell of the invention consists chiefly of ethylene-vinyl acetate copolymer and contains as an organic peroxide (crosslinker) an organic peroxide A having a 10 hour half-life temperature of 110 to 130° C. in and an organic peroxide B having a 10 hour half-life temperature of 80 to 100° C. Thereby the crosslinking time period of EVA can be reduced, and blister scarcely occurs in the crosslinked film on the crosslinked step and after that. Further yellowing owing to discoloration after long-term use can be reduced. Hence, the sealing film for a solar cell of the invention has excellent productivity, good appearance, and improved light resistance, heat resistance and heat and humidity resistance.

Particularly, the combination of dialkyl peroxide (an organic peroxide A) as chief component with a small amount of peroxy ester or peroxy ketal (an organic peroxide B) brings about great reduction of crosslinking time period, and further, in the resultant film, blister scarcely occurs on the crosslinked step and after that, and yellowing owing to discoloration of after long-term use is greatly reduced. Thus, the sealing film for a solar cell of the invention has greatly excellent productivity, good appearance, and extremely improved light resistance, heat resistance and heat and humidity resistance.

Accordingly, the solar cell provided with the sealing film of the invention also has excellent productivity, good appearance, and improved light resistance and heat and humidity resistance.

DESCRIPTION OF THE REFERENCE NUMBERS

Figure 1:
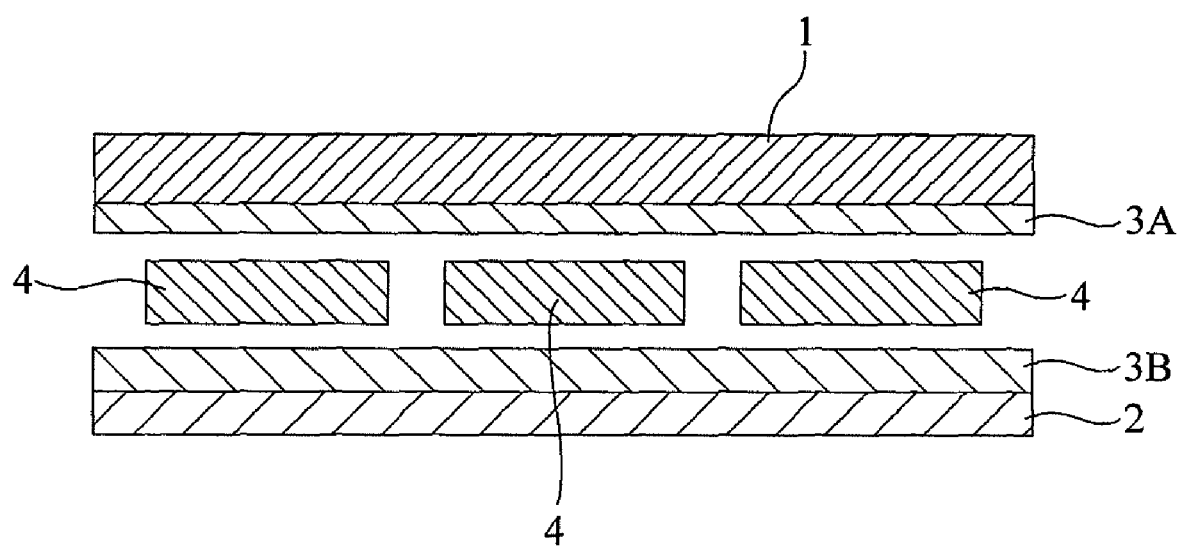
FIG. 1 is a section view showing a conventional solar cell.

1: glass plate
2: backside covering member
3A, 3B: EVA film
4: silicon photovoltaic element
22: transparent adhesive layer

DETAILED DESCRIPTION OF THE INVENTION

A sealing film for a solar cell of the invention consists chiefly of ethylene-vinyl acetate copolymer (EVA), and contains the especial two kinds of organic peroxides (crosslinker), that is an organic peroxide A having a 10 hour half-life temperature of 110 to 130° C. in and an organic peroxide B having a 10 hour half-life temperature of 80 to 100° C. Hence, the sealing film has excellent productivity, good appearance, and improved light resistance and heat and humidity resistance.

Examples of the organic peroxide A include α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide and 2,5-dimethyl-2,5-di(t-butylperoxy)hexane-3.

Examples of the organic peroxide B include 1,1-bis(t-butylperoxy)-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-dibutylperoxycyclohexyl)propane, 1,1-bis(t-butylperoxy)cyclododecane, t-hexylperoxyisopropyl monocarbonate, t-butylperoxy maleic acid (t-butylperoxy maleate), t-butylperoxy-3,3,5-trimethylcyclohexanoate, t-butylperoxy laurate, 2,5-dimethyl-2,5-di(m-toluoylperoxy)hexane, t-butylperoxyisopropyl monocarbonate, t-butylperoxy-2-ethylehexyl monocarbonate, t-hexylperoxy benzoate and 2,5-dimethyl-2,5-di(benzoylperoxy)hexane.

The organic peroxide A preferably is dialkyl peroxide represented by the following formula I:

[Formula 4]

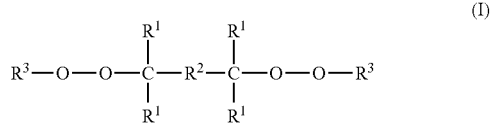

(I)

in which each of $R^1$ independently represents an alkyl group of 1 to 3 carbon atom, $R^2$ represents an ethylene group, an ethynylene group or a phenylene group, and each of $R^3$ independently represents a branched alkyl group of 3 to 5 carbon atoms or a phenyl group, and In the dialkyl peroxide of the formula I, each of $R^1$ independently represents preferably an alkyl group of 1 to 3 carbon atom such as methyl, ethyl or i-propyl; $R^2$ represents preferably an ethylene group; and each of $R^3$ independently represents preferably a branched alkyl group of 3 to 4 carbon atoms such as i-propyl, t-butyl, i-butyl, sec-butyl, pentyl or 1-methylbutyl, or a phenyl group. All $R^1$ are the same, especially methyl; $R^2$ represents an ethylene group; and $R^3$ are the same with each other, preferably t-butyl, i-butyl, sec-butyl, especially t-butyl.

It is preferred that $R^1$ represents methyl, $R^2$ represents an ethylene group; and $R^3$ represents t-butyl.

The organic peroxide A can be used singly, or in combination of two or more kinds.

The organic peroxide B is preferably peroxy ester represented by the following formula II:

[Formula 5]

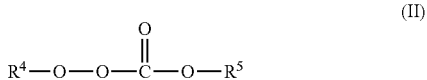

(II)

in which $R^4$ represents a branched alkyl group of 3 to 5 carbon atoms and $R^5$ represents a branched alkyl group of 6 to 9 carbon atoms, or peroxy ketal represented by the following formula III:

[Formula 6]

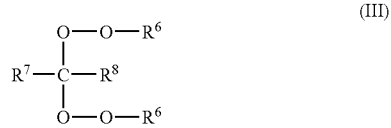

(III)

in which each of $R^6$ independently represents a branched alkyl group of 3 to 8 carbon atoms, and each of $R^7$ and $R^8$ independently represents a straight or branched alkyl group of 1 to 8 carbon atom, wherein $R^7$ and $R^8$ may unite with each other to form a ring of 5 to 9 carbon atoms. These compounds can be used singly, or in combination of two or more kinds (e.g., two or more kinds of II, two or more kinds of III, combination of II and III).

In the peroxy ester of the formula II, $R^4$ preferably represents a branched alkyl group of 3 to 5 carbon atoms such as i-propyl, t-butyl, i-butyl, sec-butyl, isopentyl, t-pentyl or neopentyl, especially t-butyl; and $R^5$ preferably represents a branched alkyl group of 6 to 9 carbon atoms such as 1-ethylbutyl, 1-methylheptyl, 1-methylhexyl, 1-ethylhexyl, 1-ethylheptyl, 2-ethylbutyl, 2-methylheptyl, 2-methylhexyl, 2-ethylheptyl, 2-ethylheptyl, especially 2-ethylhexyl.

It is preferred that in the formula II, $R^4$ represents t-butyl, $R^5$ represents ethylhexyl, especially 2-ethylhexyl.

In the peroxy ketal of the formula III, $R^6$ preferably represents a branched alkyl group of 3 to 8 carbon atoms such as i-propyl, t-butyl, i-butyl, sec-butyl, isopentyl, t-pentyl, neopentyl, t-hexyl, 1-methylheptyl, 1-methylhexyl, 1-ethylhexyl, 1-ethylheptyl, 2-ethylbutyl, 2-methylheptyl, 2-methylhexyl, 2-ethylhexyl, 2-ethylheptyl, especially t-hexyl, and $R^7$ and $R^8$ preferably represent a straight or branched alkyl group of 1 to 8 carbon atom such as methyl, ethyl, n-propyl, i-propyl, t-butyl, i-butyl, sec-butyl, isopentyl, t-pentyl, neopentyl, 1-ethylbutyl, t-hexyl, 1-methylheptyl, 1-methylhexyl, 1-ethylhexyl, 2-ethylbutyl, 2-methylheptyl, 2-methylhexyl, 2-ethylhexyl or 2-ethylheptyl.

It is preferred that $R^7$ and $R^8$ unite with each other to form a ring of 5 to 9 carbon atoms, preferably cyclohexyl having 1 to 3 methyl, more preferably trimethylcyclohexyl, especially 3,3,5-trimethylcyclohexyl.

In the formula III, it is particularly preferred that $R^6$ represents t-hexyl and $R^7$ and $R^8$ unite with each other to form trimethylcyclohexyl, especially 3,3,5-trimethylcyclohexyl.

The organic peroxide A of the formula I, as typified by dialkyl peroxide, has high half-life temperature as mentioned above, and is free from occurrence of blister and further shows relatively good yellowing resistance. However, the organic peroxide A needs relatively long time period for crosslinking of EVA. The organic peroxide B of the formula II as typified by peroxy ester or of the formula III as typified by peroxy ketal has low half-life temperature as mentioned above to reduce crosslinking time period but is apt to generate blister.

However, it has been revealed that the combination of the organic peroxides A and B brings about no occurrence of blister and enhancement of yellowing resistance even under reduced crosslinking time period of EVA. Further, there is tendency that the performances are easily obtained by crosslinking EVA at high temperature for short time period.

Particularly, the combination of the dialkyl peroxide of the formula I as chief component with a small amount of the peroxy ester of the formula II or the peroxy ketal of the formula III brings about no occurrence of blister and much enhancement of yellowing resistance even under greatly reduced crosslinking time period of EVA. Further, there is tendency that the performances are easily obtained by crosslinking EVA at high temperature for short time period.

The crosslinking temperature preferably is in the range of 135 to 180° C., further 140 to 180° C., especially 155 to 180° C. The crosslinking time period (total of degassing time described later and pressing time periods) preferably is in the range of 5 to 30 minutes, especially 5 to 15 minutes.

A ratio by weight (organic peroxide B/organic peroxide A) of the organic peroxide B to the organic peroxide A is generally in the range of 1/99 to 9/91, preferably 2/98 to 8/92, especially 3/97 to 7/93, as mentioned above.

Thus, the sealing film for solar cell shows enhanced crosslinking rate, reduction of occurrence of blister on and after the crosslinking step and great reduction of occurrence of yellowing due to discoloration, and consequently the film has excellent productivity, good appearance and enhanced light resistance, heat and humidity resistance and heat resistance.

The sealing film for solar cell of the invention can be easily prepared, for example, by forming a film using an EVA resin composition having the above requirement according to a conventional procedure.

The resultant sealing film for solar cell has generally thickness of 50 µm to 2 mm.

Subsequently, the EVA resin composition of the invention is explained.

Ethylene-vinyl acetate copolymer (EVA) is typically used as organic resin of the EVA resin composition of the invention. If necessary, polyvinyl acetal resin (e.g., polyvinyl formal, polyvinyl butyral (PVB), modified PVB) and/or polyvinyl chloride can be secondarily used. The secondary use of PVB is preferred.

In the EVA, the content of vinyl acetate recurring unit generally is in the range of 10 to 40% by weight, preferably 10 to 36% by weight, more preferably 10 to 33% by weight, especially 20 to 30% by weight. When the content is more than 40% by weight, the resin is apt to reduce in the viscosity and flow out between a glass plate and a backside covering member, and further increases in tackiness to become difficult to handle. On the other hand, when the content is less than 10% by weight, the resin reduces in processability and gives too hard film, which brings about reduction of defoaming and tends to give damage to photovoltaic elements in the preparation of a solar cell.

EVA used in the invention preferably has Melt Flow Rate of 0.7 to 40 g/10 min., especially 1.5 to 10 g/10 min.

The EVA resin composition used in the invention contains organic peroxides (crosslinkers), which brings about crosslinking structure, to enhance weather resistance. The EVA resin composition contains the specific organic peroxides, but may contain secondarily other organic peroxides.

As the specific organic peroxides, an organic peroxide A having a 10 hour half-life temperature of 110 to 130° C. in and an organic peroxide B having a 10 hour half-life temperature of 80 to 100° C. are chiefly used.

The total content of the organic peroxides is generally in an amount of 5 or less parts by weight, preferably 0.1 to 5 part by weight, especially 0.2 to 3 part by weight, based on 100 parts by weight of EVA.

A silane coupling agent can be added to the EVA resin as an adhesion promoter for enhancing the adhesive strength between the photovoltaic elements and the sealing film for solar cell.

Examples of the silane coupling agent include γ-chloropropyltrimethoxysilane, vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-aminopropyltrimethoxysilane, N-β-(aminoethyl)-γ-aminopropyltrimethoxysilane. The content of the silane coupling agent is preferably in an amount of not more than 5 parts by weight, especially 0.1 to 2 part by weight, based on 100 parts by weight of EVA.

The EVA resin composition of the invention preferably contains a crosslinking auxiliary agent (compound having radical polymerizable group as functional group) to enhance gel fraction and durability of EVA. Examples of the crosslinking auxiliary agents include tri-functional crosslinking auxiliary agents such as triallyl cyanurate and triallyl isocyanurate, mono- or di-functional crosslinking auxiliary agents such as (meth)acrylic esters (e.g., NK esters). The crosslinking auxiliary agent is generally used in an amount of 10 or less parts by weight, preferably 0.1 to 5 part by weight based on 100 parts by weight of EVA. In the invention, though the di-functional (meth)acrylic esters may be used, the tri-functional compounds are preferably used.

In order to improve the stability of the EVA resin, the EVA resin composition may contain hydroquinone, hydroquinone monomethyl ether, p-benzoquinone, and methyl hydroquinone. The additive is preferably contained in the amount of 5 or less parts by weight based on 100 parts by weight of EVA.

If necessary, in addition to the aforementioned additives, the EVA resin composition may contain coloring agent, ultraviolet absorber, antioxidant, and/or anti-discoloration agent. Examples of the coloring agent include inorganic pigments such as metallic oxide and metal powder, and organic pigments such as azo pigments, phthalocyanine pigments, azi pigments, acid dye pigments and basic dye lake pigments. Examples of the ultraviolet absorber include monohydroxy-alkoxy-benzophenone compounds such as 2-hydroxy-4-octoxybenzophenone and 2-hydroxy-4-methoxy-5-sulfobenzophenone, dihydroxy-alkoxy-benzophenone compounds such as 2,2-dihydroxy-4,4-dimethoxy-benzophenone, benzotriazole compounds such as 2-(2'-hydroxy-5-methylphenyl)-benzotriazole, and hindered phenol compounds such as phenylsalkylate and p-t-butylphenylsalkylate. Examples of a light stabilizer include hindered amines such as bis(2,2,6,6-tetramethyl-4-piperidyl) sebacate. Examples of the antioxidant include amine compounds, phenol compounds, bisphenyl compounds.

In the invention, the above-mentioned dihydroxy-dimethoxy-benzophenone ultraviolet absorbers, especially 2,2-dihydroxy-4,4-dimethoxy-benzophenone is preferably used in order to prevent yellowing.

The ultraviolet absorber and the like are each used in an amount of 0.1 to 3 part by weight based on 100 parts by weight of EVA.

The EVA resin composition of the invention, for example, can be extended by applying pressure under heating (e.g., using extrusion molding) to form the sealing film for solar cell of the invention. The heating is generally carried out at 50 to 90° C.

The solar battery is prepared using the sealing film (EVA film), as shown in FIG. 1. In more detail, a glass substrate 1, an EVA film 3A, silicone photovoltaic elements 4, an EVA film 3B and a backside covering member 2 are laminated to make a laminated bony. In the lamination, the sealing film of the invention is used as the backside EVA film 3B and the front side EVA film 3A. The laminated body can be introduced into a vacuum laminator and pressure bonded under heating in the conditions of temperature of 135 to 180° C. (preferably 140 to 180° C., especially 155 to 180° C.), degassing time period of 0.1 to 5 min., pressing pressure of 0.1 to 1.5 kg/cm² and pressing time period of 5 to 15 min., whereby the EVA films 3A, 3B are crosslinked to bring about a sealing film or a solar cell having excellent light resistance, heat resistance and weather resistance.

The glass plate 1 of the invention generally is silicate glass. A thickness of the glass plate is generally in the range of 0.1 to 10 mm, preferably 0.3 to 5 mm. The glass plate is tempered in heat or chemical resistance.

The backside covering member 2 of the invention preferably is generally a plastic film (e.g., PET), but preferably fluorinated polyethylene film or polyfluoroethylene film from the viewpoint of heat resistance.

The invention is illustrated in detail using the following Examples.

EXAMPLE

Example 1

| [EVA resin composition: Formulation 1 (part(s) by weight)] | |
|---|---|
| EVA resin (content of vinyl acetate: 26 wt. %, Melt Flow Rate: 4 g/10 min,): | 100 |
| Crosslinker 1 (organic peroxide A) (2,5-dimethyl-2,5-bis(t-butylperoxy) hexane): | 1.3 |
| Crosslinker 2 (organic peroxide B) (t-butylperoxy-2-ethylhexyl monocarbonate): | 0.1 |
| Crosslinking auxiliary (triallyl isocyanurate): | 1.5 |
| UV absorber 1 (2,2'-dihydroxy-4,4'-dimethoxybenzophenone): | 0.03 |
| Additive 1: silane coupling agent (γ-methacryloxypropyl trimethoxy silane): | 0.3 |

The EVA resin composition having the above formulation 1 was processed by calendaring process at 80° C. to prepare an EVA sheet. The thickness was 600 μm.

The resultant EVA film was used as the front side EVA film 3A and the backside EVA film 3B of FIG. 1. As shown in FIG. 1, silicone photovoltaic elements 4 were sealed between a glass substrate 1 having thickness of 3 mm and a backside covering member 2 (thickness of 38 μm) made of fluorinated polyethylene using the EVA films 3A, 3B, whereby a solar cell was obtained. The sealing was carried out by pressure bonding under heating the laminate including the EVA films 3A, 3B using a vacuum laminator in vacuum and in the conditions of temperature of 155 to 180° C., degassing time period of 3 min. and pressing time period of 10 min., whereby the EVA films 3A, 3B were crosslinked.

Example 2

| [EVA resin composition: Formulation 2 (part(s) by weight)] | |
|---|---|
| EVA resin (content of vinyl acetate: 26 wt. %, Melt Flow Rate: 4 g/10 min,): | 100 |
| Crosslinker 1 (organic peroxide A) (2,5-dimethyl-2,5-bis(t-butylperoxy) hexane): | 1.3 |
| Crosslinker 2 (organic peroxide B) (t-butylperoxy-2-ethylhexyl monocarbonate): | 0.05 |
| Crosslinking auxiliary (triallyl isocyanurate): | 1.5 |
| UV absorber 1 (2,2'-dihydroxy-4,4'-dimethoxybenzophenone): | 0.03 |

The procedures of Example 1 were repeated except for using the EVA resin composition having the above formulation 2 to prepare a solar cell.

Example 3

| [EVA resin composition: Formulation 3 (part(s) by weight)] | |
|---|---|
| EVA resin (content of vinyl acetate: 26 wt. %, Melt Flow Rate: 4 g/10 min,): | 100 |
| Crosslinker 1 (organic peroxide A) (2,5-dimethyl-2,5-bis(t-butylperoxy) hexane): | 1.5 |

-continued

[EVA resin composition: Formulation 3 (part(s) by weight)]

| | |
|---|---|
| Crosslinker 2 (organic peroxide B) (t-butylperoxy-2-ethylhexyl monocarbonate): | 0.1 |
| Crosslinking auxiliary (triallyl isocyanurate): | 1.5 |
| UV absorber 1 (2,2'-dihydroxy-4,4'-dimethoxybenzophenone): | 0.03 |

The procedures of Example 1 were repeated except for using the EVA resin composition having the above formulation 3 to prepare a solar cell.

Example 4

[EVA resin composition: Formulation 4 (part(s) by weight)]

| | |
|---|---|
| EVA resin (content of vinyl acetate: 26 wt. %, Melt Flow Rate: 4 g/10 min,): | 100 |
| Crosslinker 1 (organic peroxide A) (2,5-dimethyl-2,5-bis(t-butylperoxy) hexane): | 1.5 |
| Crosslinker 2 (organic peroxide B) (t-butylperoxy-2-ethylhexyl monocarbonate): | 0.14 |
| Crosslinking auxiliary (triallyl isocyanurate): | 1.5 |
| UV absorber 1 (2,2'-dihydroxy-4,4'-dimethoxybenzophenone): | 0.03 |

The procedures of Example 1 were repeated except for using the EVA resin composition having the above formulation 4 to prepare a solar cell.

Comparison Example 1

The procedures of Example 1 were repeated except for using the EVA resin composition having the above formulation 1 wherein the amount of the crosslinker 1 is changed to 1.26 part by weigh, the amount of the crosslinker 2 is changed to 0.14 part by weigh and the amount of the crosslinking auxiliary is changed to 0.5 part by weigh to prepare a solar cell.

Comparison Example 2

The procedures of Example 1 were repeated except for using the EVA resin composition having the above formulation 1 wherein the amount of the crosslinker 1 is changed to 0.7 part by weigh, the amount of the crosslinker 2 is changed to 0.7 part by weigh and the amount of the crosslinking auxiliary is changed to 0.5 part by weigh to prepare a solar cell.

Comparison Example 3

The procedures of Example 1 were repeated except for using the EVA resin composition having the above formulation 1 wherein the amount of the crosslinker 1 is changed to 1.0 part by weigh and the amount of the crosslinker 2 is changed to 0.35 part by weigh to prepare a solar cell.

<Evaluation on Sealing Film for Solar Cell>

(1) Gel Fraction (%)

A portion (approx. 1 g) of the sealing film of the resultant solar cell is immersed in 100 ml of xylene and heated at 120° C. for 24 hours, and then filtered to collect an unsolved portion. The unsolved portion is dried and weighed whereby the gel fraction is determined.

(2) Heat and Humidity Resistance (Durability Test Under 130° C.)

The resultant solar cell is allowed to stand for 1,000 hours under the environment (temperature of 85° C. and relative humidity of 85%) according to JIS C 8917. Thereafter difference ($\Delta$YI value) between yellowness indexes (YI values) of the solar cell before and after allowing it to stand is measured according to K 7501 using Color Computer SM-5 (available from Suga Test Instruments Co., Ltd.).

(3) Light Resistance (Weather Resistance) (Accelerated Durability Test)

The resultant solar cell is allowed to stand for 1,000 hours under the environment including exposure to ultraviolet radiation (temperature of 63° C., relative humidity of 53% and exposure to ultraviolet radiation of 1,000 W/m$^2$) according to JIS C 8917. Thereafter in order to examine yellowing after the exposure to ultraviolet radiation, difference ($\Delta$YI value) between yellowness indexes (YI values) of the solar cell before and after allowing it to stand is measured according to K 7501 using Color Computer SM-5 (available from Suga Test Instruments Co., Ltd.).

(4) Heat Resistance

The resultant solar cell is allowed to stand for 1,000 hours under the environment (temperature of 85° C.). Thereafter difference ($\Delta$YI value) between yellowness indexes (YI values) of the solar cell before and after allowing to stand it is measured using Color Computer SM-5 (available from Suga Test Instruments Co., Ltd.).

(5) Foaming (Blister)

The resultant solar cell is allowed to stand for 800 hours under the environment (temperature of 85° C. and relative humidity of 85%). Thereafter the appearance is visually observed (foaming, blister) to evaluate as follows:
  ○: foaming or blister is not observed
  x: foaming or blister is not observed The obtained results are set forth below.

TABLE 1

| Formulation | Ex. 1 | Ex. 2 | Ex. 3 | Ex. 4 | Co. 1 | Co. 2 | Co. 3 |
|---|---|---|---|---|---|---|---|
| EVA (VA: 26%) | 100 | 100 | 100 | 100 | 100 | 100 | 100 |
| Crosslinker 1 | 1.3 | 1.3 | 1.5 | 1.5 | 1.26 | 0.7 | 1.0 |
| Crosslinker 2 | 0.1 | 0.05 | 0.1 | 0.14 | 0.14 | 0.7 | 0.35 |
| Crosslinking auxiliary | 1.5 | 1.5 | 1.5 | 1.5 | 0.5 | 0.5 | 1.5 |
| UV absorber 1 | 0.03 | 0.03 | 0.03 | 0.03 | 0.03 | 0.03 | 0.03 |
| Evaluation Gel fraction (%) | 90 | 90 | 90 | 90 | 90 | 90 | 90 |
| Heat resistance ($\Delta$YI) | −1.3 | −1.4 | −0.4 | −0.3 | 2.0 | 7.0 | −0.5 |

TABLE 1-continued

| Formulation | Ex. 1 | Ex. 2 | Ex. 3 | Ex. 4 | Co. 1 | Co. 2 | Co. 3 |
|---|---|---|---|---|---|---|---|
| Heat-humidity resistance (ΔYI) | −0.9 | −0.2 | −0.2 | −0.1 | 2.0 | 3.2 | 1.1 |
| UV resistance (ΔYI) | 0.6 | 0.6 | 1.2 | 0.9 | 0.8 | 0.3 | 1.0 |
| Blister | ○ | ○ | ○ | ○ | x | x | x |

As apparent from the results of Table 1, the sealing film of the invention (Examples 1-4) containing the dialkyl peroxide as chief component and a small amount of the alkyl peroxy ester showed no occurrence of blister on the crosslinked step and after that, and extremely improved heat resistance, heat and humidity resistance and light resistance (durability), even by crosslinking the EVA film at enhanced temperature for reduced time period.

In contrast, the sealing film (Comparison Examples 1-3) containing 10% or more by weight of alkyl peroxy ester showed occurrence of blister and yellowing.

INDUSTRIAL APPLICABILITY

The sealing film for solar cell of the invention has excellent productivity and good appearance, and further possesses light resistance, heat and humidity resistance and heat resistance. Hence, use of the sealing film brings about a solar cell having excellent productivity, good appearance, and improved light resistance and heat and humidity resistance.

The invention claimed is:

1. A sealing film for a solar cell comprising ethylene-vinyl acetate copolymer and an organic peroxide,
wherein the organic peroxide comprises an organic peroxide A having a 10 hour half-life temperature of 110 to 130° C. and an organic peroxide B having a 10 hour half-life temperature of 80 to 100° C., and a ratio by weight (organic peroxide B/organic peroxide A) of the organic peroxide B to the organic peroxide A is in the range of 1/99 to 9/91.

2. A sealing film for a solar cell as defined in claim 1, wherein the organic peroxide A is dialkyl peroxide represented by the following formula I:

[Formula 1]

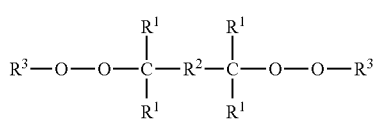
(I)

in which each of $R^1$ independently represents an alkyl group of 1 to 3 carbon atom, $R^2$ represents an ethylene group, an ethynylene group or a phenylene group, and each of $R^3$ independently represents a branched alkyl group of 3 to 5 carbon atoms or a phenyl group, and the organic peroxide B is peroxy ester represented by the following formula II:

[Formula 2]

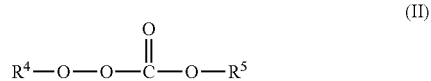
(II)

in which $R^4$ represents a branched alkyl group of 3 to 5 carbon atoms and $R^5$ represents a branched alkyl group of 6 to 9 carbon atoms, and/or peroxy ketal represented by the following formula III:

[Formula 3]

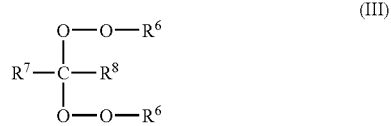
(III)

in which each of $R^6$ independently represents a branched alkyl group of 3 to 8 carbon atoms, and each of $R^7$ and $R^8$ independently represents a straight or branched alkyl group of 1 to 8 carbon atom, wherein $R^7$ and $R^8$ may unite with each other to form a ring of 5 to 9 carbon atoms.

3. A sealing film for a solar cell as defined in claim 2, wherein, in the formula I, $R^1$ represents a methyl group, $R^2$ represents an ethylene group, and $R^3$ represents a tert-butyl group.

4. A sealing film for a solar cell as defined in claim 2, wherein, in the formula II, $R^4$ represents a tert-butyl group, and $R^5$ represents an 2-ethylhexyl group.

5. A sealing film for a solar cell as defined in claim 2, wherein, in the formula III, $R^6$ represents a tert-hexyl group, and $R^7$ and $R^8$ unit with each other to form 3,3,5-trimethyl-cyclohexyl.

6. A sealing film for a solar cell as defined in claim 1, wherein the organic peroxide is contained in the amount of 0.1 to 5.0 part by weight based on 100 parts by weight of the ethylene-vinyl acetate copolymer.

7. A sealing film for a solar cell as defined in claim 1, wherein a ratio by weight (organic peroxide B/organic peroxide A) of the organic peroxide B to the organic peroxide A is in the range of 2/98 to 8/92.

8. A sealing film for a solar cell as defined in claim 1, wherein a crosslinking auxiliary agent is contained in the amount of 0.1 to 5.0 part by weight based on 100 parts by weight of the ethylene-vinyl acetate copolymer.

9. A sealing film for a solar cell as defined in claim 1, which further contains a dihydroxydimethoxybenzophenone ultraviolet absorber.

10. A sealing film for a solar cell as defined in claim 1, which further contains a silane-coupling agent.

11. A sealing film for a solar cell as defined in claim 1, wherein a vinyl acetate recurring unit of the ethylene-vinyl acetate copolymer is contained in the amount of 10 to 36% by weight based on the weight of the ethylene-vinyl acetate copolymer.

12. A sealing film for a solar cell as defined in claim 1, which has yellowness index ($\Delta YI$) of not more than 1.5, the yellowness index being measured according to JIS K 7501 after allowing the sealing film to stand for 1,000 hours under the environment (temperature of 85° C. and relative humidity of 85%) according to JIS C 8917.

13. A sealing film for a solar cell as defined in claim 1, which has yellowness index ($\Delta YI$) of not more than 2.0, the yellowness index being measured according to JIS K 7501 after allowing the sealing film to stand for 1,000 hours under the environment including exposure to ultraviolet radiation (temperature of 63° C., relative humidity of 53% and exposure to ultraviolet radiation of 1,000W/m$^2$) according to JIS C 8917.

14. A solar cell comprising a transparent front side protection material, a backside protection material and photovoltaic elements sealed therebetween by a sealing film,
wherein the sealing film for a solar cell as defined in claim 1 is interposed between the transparent front side protection material and backside protection material to be crosslinked and combined with each other.

15. A process for the preparation of a solar cell comprising interposing two sealing films between a transparent front side protection material and a backside protection material, interposing photovoltaic elements between the two sealing films and bonding them under pressure to seal the photovoltaic elements,
wherein the sealing film for a solar cell as defined in claim 1 is used, and after interposing of the photovoltaic elements, they are bonded under pressure and heating at temperature of 135 to 180° C. for 5 to 15 minutes to be crosslinked and combined with each other.

16. A process for the preparation of a solar cell as defined in claim 15, the temperature is in the range of 155 to 180° C.

* * * * *